(12) United States Patent
Meyer-Berg

(10) Patent No.: US 7,129,570 B2
(45) Date of Patent: Oct. 31, 2006

(54) ELECTRONIC COMPONENT HAVING AT LEAST ONE SEMICONDUCTOR CHIP ON A CIRCUIT CARRIER AND METHOD FOR PRODUCING THE SAME

(75) Inventor: Georg Meyer-Berg, München (DE)

(73) Assignee: Infineon Technologies AG (DE)

( * ) Notice: Subject to any disclaimer, the term of this patent is extended or adjusted under 35 U.S.C. 154(b) by 297 days.

(21) Appl. No.: 10/784,243

(22) Filed: Feb. 24, 2004

(65) Prior Publication Data

US 2004/0164400 A1   Aug. 26, 2004

(30) Foreign Application Priority Data

Feb. 24, 2003   (DE) ................. 103 08 095

(51) Int. Cl.
*H01L 23/02* (2006.01)
(52) U.S. Cl. ............... 257/678; 257/693; 257/777
(58) Field of Classification Search ........... 257/678, 257/693, 777
See application file for complete search history.

(56) References Cited

U.S. PATENT DOCUMENTS

| | | |
|---|---|---|
| 5,199,163 A | 4/1993 | Ehrenberg et al. |
| 5,929,516 A | 7/1999 | Heerman et al. |
| 6,163,070 A | 12/2000 | Mori |
| 6,433,419 B1 | 8/2002 | Khandros |
| 2002/0079575 A1 | 6/2002 | Hozoji et al. |
| 2003/0067755 A1 | 4/2003 | Haimerl et al. |

FOREIGN PATENT DOCUMENTS

| | | |
|---|---|---|
| DE | 100 23 823 A1 | 12/2001 |
| DE | 10059178 C2 | 6/2002 |
| JP | 09214052 A | 8/1997 |
| JP | 11-260 963 A | 12/1998 |

*Primary Examiner*—Fetsum Abraham
(74) *Attorney, Agent, or Firm*—Edell, Shapiro & Finnan, LLC

(57) ABSTRACT

An electronic component includes at least one semiconductor chip, which has an active chip top side with contact areas and has a chip rear side arranged on a carrier top side of a circuit carrier. The circuit carrier and the chip top side are covered by a common rewiring layer having external contact areas at a different level. The different level is matched to a common level of external contact top sides by means of different heights of in part compliant external contacts.

11 Claims, 3 Drawing Sheets

ELECTRONIC COMPONENT HAVING AT LEAST ONE SEMICONDUCTOR CHIP ON A CIRCUIT CARRIER AND METHOD FOR PRODUCING THE SAME

CROSS REFERENCE TO RELATED APPLICATIONS

This application claims priority under 35 USC §119 to German Application No. 10308095.3-33, filed on Feb. 24, 2003, and titled "Electronic Component Having At Least One Semiconductor Chip On A Circuit Carrier And Method For Producing The Same," the entire contents of which are hereby incorporated by reference.

FIELD OF THE INVENTION

The invention relates to an electronic component having a semiconductor chip, which has contact areas and is arranged with its rear side on a circuit carrier, and a method for producing such an electronic component.

BACKGROUND

As the number of external contacts increases, it becomes more difficult to provide a sufficiently large and dimensionally stable circuit carrier on which both the external contacts and semiconductor chips can be arranged. This is because functional disturbances often occur during the production of the electronic component or during thermal functional tests of such large electronic components. Moreover, placement of differently sized external contacts in the case of such electronic components on a planar top side of a printed circuit board is difficult, if the components are intended to be connected to a superordinate circuit substrate, for example, of a printed circuit board.

SUMMARY

A reliably operating electronic component having at least one semiconductor chip on a circuit carrier and a method for producing the same in which placement of the electronic component on printed circuit boards of superordinate circuits is facilitated can be provided. Furthermore, it a production method which is less expensive than standard methods in conjunction with improved environmental compatibility can be provided.

According to the invention, an electronic component includes one or a plurality of semiconductor chips, each having an active chip top side and a chip rear side. The chip top side has contact areas connected to electrodes of an integrated circuit on the semiconductor chip. The semiconductor chip is arranged with its chip rear side on a carrier top side of a circuit carrier. In this case, a rewiring layer extends over the chip top side and over the carrier top side which is not covered by the semiconductor chip. The rewiring layer has external contacts arranged on external contact areas. The external contacts equalize a level difference between the chip top side and the carrier top side by means of different heights, so that their external contact top sides essentially lie at a common level.

Such a component has the advantage that the external contacts and the semiconductor chip are arranged on the same top side of the circuit carrier. Consequently, the circuit carrier does not need to be equipped either with passage contacts or with a rewiring structure before the semiconductor chip is applied to the carrier top side. The circuit carrier may merely have a smoothed planar top side even without any complex patterning. A further advantage is that the top side of the semiconductor chip and the carrier top side, which is not covered by the semiconductor chip, are available for the placement of external contacts without tips or outermost top sides of the external contacts having different levels, except for those level differences which, if appropriate, are intended to equalize different solder paste thicknesses. This common level of the external contact top sides facilitates a mounting of the electronic component on a superordinate circuit substrate such a printed circuit board with a planar placement area.

The circuit carrier may have materials whose thermal expansion coefficients are adapted to the thermal expansion coefficient of the circuit substrate or the material of the semiconductor chip.

Small thermal stresses between the circuit carrier and a superordinate circuit substrate are achieved, according to the invention, by circuit carriers made of metals whose expansion coefficients are adapted to the superordinate circuit substrate and to a printed circuit board. A rubber-elastic insulation layer may be applied to the metal plate and to the semiconductor chip, and enables a gentle transition from the metal top side to the chip top side. The gentle transition ensures that a metal structure comprising conductor tracks and external contact areas which is applied to the common rubber-elastic layer forms a reliable connection. An abrupt transition from the circuit carrier top side to the semiconductor chip side and unreliable electrical connections associated herewith are thus avoided.

Iron-chromium-nickel alloys are used as the circuit carrier material onto which the semiconductor chips are adhesively bonded and the rubber-elastic insulation layer is applied, the thermal expansion coefficients of which alloys, between 11.3 and 16.6, can be adapted to the circuit carrier of a superordinate circuit with the aid of different proportions of chromium, nickel and iron.

Given a nickel content of 30 to 32% by weight with 19 to 21% by weight of chromium and proportions of aluminium, titanium and silicon of in each case<1% by weight, the remainder being iron, the thermal expansion coefficient lies between 15.1 and 16.6 (ppm per $°$ K) at temperatures of between 20° C. and 400° C.

Given a nickel content of 58 to 63% by weight with between 22 and 24% by weight of chromium and proportions of aluminium, titanium and silicon of $\leq 1.5\%$ by weight, the remainder being iron, the thermal expansion coefficient lies between 13.8 and 14.8 (ppm per $°$ K) at temperatures in the range of 20° C. to 200° C. The same range for the thermal expansion coefficient is covered by an alloy having 72% by weight of nickel and 14 to 17% by weight of iron and 6 to 10% by weight of chromium, and in addition in each case$\leq 1\%$ by weight of the metals aluminium, titanium and silicon.

For a thermal expansion coefficient of between 11.9 and 15.5 at 20° to 400° C., use is advantageously made of a metal alloy comprising 8 to 11% by weight of iron, 24 to 26% by weight of chromium and $\leq 2\%$ by weight in each case of silicon, titanium and aluminium, the remainder being nickel.

In order to additionally improve the thermal conductivity of these materials, it is possible, after preparatory sputtering, if appropriate, for copper or aluminium to be applied galvanically to the circuit carrier either on one side or on both sides.

Alloys of this type are known under the trade name "Nicrofer". One advantage is that these metal alloys can be adapted to the expansion behaviour of a circuit substrate of a superordinate circuit in such a way that the relatively large outer external contacts on the circuit carrier of the electronic component according to the invention can be applied for the height equalization of the height difference between circuit carrier top side and semiconductor chip top side with soldering balls without any elastic compensation. They thus enable a stable and reliable connection between the electronic component and the circuit substrate, of the superordinate circuit. Electronic components which have hitherto been produced using BGA technology (ball grid array technology) can be replaced, less expensively and without the use of plastics moulding compositions, by components according to the invention, in particular when dispensing with flexible external contacts on the semiconductor chip.

A component according to the invention with a circuit carrier made of metals does not have any moulding compositions which constitute radioactive loads and cause software error rates in the form of an increase in the bit error rate per time. Contamination-dictated alpha radiators in moulding compositions produce erroneous data in memories, such as DRAMs or SRAMs, which is overcome by the component according to the invention, which does not have any moulding compositions.

Soldering balls made of tin/lead alloys or tin/lead mixtures, as are used in BGA technology, also emit alpha particles exclusively sporadically. However, in contrast to BGA technology or flip-chip technology, the solder balls are not arranged on the semiconductor chip but rather on the circuit carrier, so that, given the small range of the alpha particles which emanate from the solder balls, the component according to the invention does not exhibit a source of software errors.

While the outer edge region of the electronic component can be stabilized with fixing, relatively large and high external contacts made of solder material in the form of solder balls at a superordinate circuit substrate, the external contacts which are present, if appropriate, on the semiconductor chip are embodied such that they are lower and always rubber-elastic. The rubber-elastic and thus compliant external contacts on the semiconductor chip have the advantage that mechanical stresses do not occur at the chip surface even though the expansion coefficients of semiconductor chip and circuit substrate are not adapted to one another. Nevertheless, the reliability of sensitive analogue circuits and sensitive DRAMs is thus improved, especially since stresses caused by the otherwise customary moulding compositions are obviated.

Use of rubber-elastic external contacts spontaneously increases the current-carrying capacity from 40 mA per external contact of conventional type to 500 mA per external contact of the invention. This advantage is provided for rubber-elastic external contacts and is can occur for rubber-elastic external contacts and when the external contacts on the circuit carrier also have a rubber-elastic construction.

Since, in the case of the component according to the invention, the semiconductor chips are adhesively bonded by their rear sides onto the metal area of the circuit carrier, the impairment of the semiconductor property on account of the different thermal expansion coefficients is negligible, especially because of the availability of tried and tested, both stress-reducing and good thermal conductive adhesives with 10 W/m° K in IC adhesive bonding technology.

The connection of the semiconductor chip to a metallic metal carrier via an adhesive layer furthermore has the advantage that, when a conductive adhesive is used, the rear side of the semiconductor chip can be put at the lowest potential or at the earth potential of a circuit. Furthermore, the metallic surface carrier forms a heat sink via which the heat loss of the semiconductor chip can be dissipated to the surroundings.

Furthermore, it is possible, instead of one semiconductor chip, to arrange a plurality of thinly ground semiconductor chips one above the other and to provide, for the lower semiconductor chips, rewiring via the semiconductor chip edges to the external contact areas on the circuit substrate. In this case, the areas of the stacked semiconductor chips may be of different sizes. The semiconductor chip having the largest top side to be applied first to the metallic circuit carrier and for the further semiconductor chips having top sides which decrease in size in graduated fashion to be stacked thereon.

The insulation layer between the metal structures with conductor tracks and with external contact areas and the conductive metallic circuit carrier is stiffer in comparison with the rubber-elastic plastic of the rubber-elastic external contact bodies of the external contacts on the semiconductor chip. The insulation layer can also be constructed as a multilayer three-dimensional rewiring structure including a plurality of insulation and conductor track layers.

The gentle transition between semiconductor chip top sides and circuit carrier top sides is realized by the rubber-elastic plastic in the same method step used to produce the rubber-elastic external contact bodies. In the case of very large semiconductor chips having an active top side greater than 100 mm$^2$, rewiring lines on the rubber-elastic transitions from the semiconductor chip to the circuit carrier, which have an arcuate structure or a meandering structure, can compensate for tensile loads on the lines.

The rubber-elastic layer, which is produced in a printing method and carries the external contact areas made of metal, has, in the region of the semiconductor chip, passage openings as far as the contact areas on the top side of the semiconductor chip. The patterned metal layer on the top side of the rubber-elastic insulation layer thus additionally has, besides the external contact areas and the conductor tracks to the contact areas on the top side of the semiconductor chip, conduction paths leading from the topmost contact areas of the elastic external contacts as far as the contact areas on the top side of the semiconductor chip.

This rewiring structure with external contacts, conductor tracks and conduction paths can be produced by means of a single metallization and photolithography step. Thus, after the semiconductor chips have been adhesively bonded onto the circuit substrate, all that are required are method steps which are required for forming the elastic contacts. This reduces the production costs since separately produced rewiring plates are not required. Furthermore, the rewiring structure may be embodied both on the circuit carrier and on the semiconductor chip in multilayer fashion with corresponding intermediate insulation layers.

The use of metals for the circuit carrier can provide that the metals can be polished like semiconductor wafers on their top sides. This makes it possible to use thin-film techniques, a multilayer coating of circuit carrier and semiconductor chip with a multilayer rewiring layer being effected, as are otherwise used for the production of semiconductor chips on semiconductor wafers themselves. Such precision and miniaturization with regard to surface quality or patterning cannot usually be achieved with a printed circuit board material.

Furthermore, the circuit carrier may have the form of a wafer on which the semiconductor chips are arranged in rows and columns at component positions. Such a circuit carrier, which may also be standardized to the dimensions of silicon wafers, has the advantage that, even though it is possibly produced from sapphire, glasses or metals, it can be processed in standardized installations appertaining to the semiconductor industry, which enables mass production of the electronic components according to the invention at prices which are considerably less than the prices for standard components.

Furthermore, provision is made for providing at least one portion of the external contacts on the semiconductor chip with conduction paths on compliant bumps as external contact bodies. These external contacts realized on a compliant external contact body make it possible to permit larger tolerances in the levelling of the different heights in the Z direction for the external contacts. Moreover, semiconductor chips having top sides of greater than 10 mm$^2$ are reliably provided with external contacts even though the thermal expansion behaviour differs in the X and Y directions of semiconductor chip and superordinate circuit substrate.

Furthermore, the component has the advantage that minimal thermal warpage of the compliant external contacts is compensated for. Finally, on account of the compliance of the external contacts, it is possible to compensate for the shear stress in the event of thermal loading.

Since the thermal expansion coefficient of the semiconductor chip, in particular of silicon, is about 4 ppm/° K and a printed circuit board material with glass fibre reinforcement of a printed circuit board of a superordinate circuit substrate which is to be mechanically connected to the external contacts of the electronic component has an expansion coefficient of between 13 and 16 ppm/° K, shear stresses arise between the electronic component and the printed circuit board, in particular, for external contacts on the semiconductor chip of the electronic component. These loads are absorbed by the compliant external contacts.

In order to realize a circuit module, it is furthermore possible for one or a plurality of semiconductor chips to be applied by their rear sides on a circuit carrier made of semiconductor material, which may also have an integrated circuit. For this purpose, the carrier top side of the circuit carrier which is not covered by semiconductor chips and the active top side of the semiconductor chips are covered with a common rewiring layer, the rewiring layer having, on the semiconductor chip, external contacts having a smaller height than the external contacts arranged on the rewiring layer in the region of the carrier top side of the circuit carrier. The level difference between the chip top side and the carrier top side is levelled by external contacts of different heights in such a way that the external contact top sides essentially lie at a common level again.

In such a circuit module, a multiplicity of external contacts are levelled and can thus be applied in a simple manner on a printed circuit board of a superordinate circuit on a planar placement level. As explained above for an electronic component according to the invention, similar results can occur for the electronic module having stacked semiconductor chips and/or having areally arranged semiconductor chips.

A method for producing electronic components can include the following steps. Firstly, a wafer-type or rectangular circuit carrier made of metal with component positions arranged in rows and columns is produced. An insulation layer is subsequently applied to the metallic surface carrier. The insulation layer can be constructed from a photolithographically patternable material, such as benzocyclobutene, called BCB below, or polyimide, called PI below. Consequently, it is possible to introduce structures such as separating tracks and chip islands into the insulation layer, if these are intended to remain free of the insulation material for further method steps. The insulation layer can be constructed from relatively stiff material having no rubber-elastic properties. Semiconductor chips can then be fitted in the component positions with their chip rear sides being fixed on the carrier top side or on the insulation layer.

A rubber-elastic structure can be subsequently applied with the contact areas of the semiconductor chip being left free and with rubber-elastic external contact bodies being formed. In this case, the abrupt transition from the carrier top side to the chip top side is at the same time rounded by the rubber-elastic composition used for the rubber-elastic external contact bodies. A patterned metal layer is then applied with the formation of rewiring lines from the contact areas on the chip top side to external contact areas on the circuit carrier, and also conduction paths from the contact areas to the elastic external contact bodies.

Finally, outer soldering external contacts are applied with a different height from the rubber-elastic external contacts as level equalization between chip top sides and carrier top sides in such a way that the external contact top sides of the different external contacts form a common level. If rubber-elastic external contacts are provided both on the carrier top side and on the chip top side, then the separate application of outer external contacts on the circuit carrier is obviated. Finally, the circuit carrier having a plurality of component positions may be divided into individual components.

Such a method has the advantage that a thin-film technique can be used instead of the previous printed circuit board technology. Such a technique enables structures which are approximately as small as in the semiconductor industry. Furthermore, it is possible to use methods of semiconductor technology for highly polished planar surfaces, so that it is possible to realize rewiring layers with external contact areas and rewiring lines with the precision of interconnects on semiconductor wafers. For this purpose, only planar surfaces of the circuit carriers are necessary and it is not necessary to prepare any passage contacts or rewiring structures whatsoever on the carrier top side. A semiconductor chip is merely applied by a rear side in each component position. This application may be effected by means of an elastic insulating adhesive layer or a conductive adhesive layer in the component positions, depending on whether or not an electrical connection is to be produced between the chip rear side of the semiconductor chip and the circuit carrier.

In the course of adhesively bonding the semiconductor chips onto the circuit carrier, it is possible for an adhesive meniscus to form at the edge sides of the semiconductor chips, which meniscus forms a gentle transition at the semiconductor chip edge from the level of the carrier top side to the level of the chip top side. The level differences between carrier top side and chip top side are overcome better during the application both of a patterned insulation layer and of a patterned metal layer for a rewiring structure. The risk of cracks of conductor tracks in the rewiring structure or the formation of microcracks in the insulation structure is thereby effectively reduced, especially since the meniscus creates adhesion spaces which improve the adhesion.

The method for applying the common rewiring layer to carrier top side and top side of the semiconductor chip can include the following method steps. Firstly, a three-dimensional closed metal layer is applied to the structure comprising relatively stiff insulation layer of the remaining carrier top side and on the chip top side with rubber-elastic external contact body and fluid transitions from the level of the carrier top side to the level of the chip top side. The closed metal layer is subsequently etched to form a three-dimensional rewiring structure with the aid of corresponding masks, conduction paths to external contact areas on the external contact bodies and rewiring lines from the contact areas on the semiconductor chip to external contact areas on the carrier substrate simultaneously being formed. Afterwards, the external contact areas are refined by means of a solderable coating in the region of the semiconductor chip on the external contact bodies and the region of the circuit carrier.

This method has the advantage that, with very simple means and with a small number of steps, the contact areas which are arranged on the semiconductor chip with fine step sizes of a few tens of μm can be connected via the rewiring lines of the common rewiring layer to external contacts which can be arranged in distributed fashion on the entire surface of semiconductor chip top side and carrier top side.

To summarize, the following advantages are afforded:

a) Mechanically equalizing contacts applied individually or in area processes reduce the forces in the event of thermomechanical stress and thus significantly increase the reliability. The mechanical equalization of the contacts may be effected in diverse ways, namely
  i) by compliant external contact pins,
  ii) by microsprings,
  iii) by organic, mechanically equalizing electrical contacts, essentially any conductive compliant structure being able to be used.
b) The direct thin-film connection of the integrated circuits makes it possible to produce very high densities for the contact areas and also for the external contacts in the input and output regions.
c) In the case of simple wiring structures, the wiring process may already be supplied during the production of the contacts, so that the costs for the additional thin-film process can be saved, appropriately, or the latter can at least be simplified.
d) The electronic component has a construction which enables a considerably improved heat dissipation by virtue of low heat transfer resistances from the rear side of the semiconductor chip directly into the circuit carrier material, very good thermal conductivities of, for example in the case of silicon circuit carriers, approximately 100 W/mK optionally being achieved, which are still effective at 125° K, and a thermal conductivity of 380 W/mK can be achieved in the case of circuit carriers made of copper, a value of 135 W/mK can be achieved in the case of circuit carriers made of molybdenum, and a value of 15 W/mK can additionally be achieved in the case of circuit carriers made of nicrofer. These circuit carriers may be cooled directly by air. A heat conduction value of 1 W/mK additionally results for glass as circuit carrier. In the case of glass, the heat dissipation is dependent on the overall construction of the respective rewiring structure, the metal of which enables a heat dissipation.
e) Circuit carriers made of glass afford the possibility, owing to the low conductivity, of placing semiconductor chips having integrated circuits with heat emission beside temperature-sensitive components on the same circuit carrier, especially because then the heat is dissipated through the surface of the semiconductor chips. Heating of adjacent semiconductor chips in a module is greatly reduced in the case of circuit carriers made of glass.
f) A higher electrical performance results by virtue of the direct routing of the electrical freely scaleable short line to air with the aid of the nearest shielding planes. As a result, the construction can be used specifically also for radio frequency applications or for a mixture of digital applications and radio frequency applications. Radio frequency applications can benefit from the fact that the rear side of the semiconductor chips can be connected to earth.
g) By virtue of the fact that it is possible to use in part thin-film circuit carriers in the standard wafer format, such as, for example, 200 mm (wafer diameter) or 300 mm (wafer diameter), it is possible to process whole wafers during process steps up to the singulation of the individual electronic components.
h) By virtue of the fact that the conductive external contacts afford the thermomechanical equalization, it is possible to dispense with any underfill in a component housing between semiconductor chip and circuit carrier, so that a component according to the invention can be triggered again in the event of malfunctions and repairs can thus be permitted.
i) Due to the low costs per wiring density of the thin-film technology and the continuous wafer processing, the cost per connection are considerably lower than in the case of conventional BGA components (ball grid array components) especially for electronic components having very many connections and in the case of large semiconductor chip areas, in particular, also because the entire area of the package is available for the external contacts of the electronic component.
j) Owing to the only very thin layers of the rewiring layer above the active surface of the semiconductor chip, the mechanical loading in the event of temperature changes, in particular, at low temperatures, is lower than in the case of conventional housing technologies.
k) By virtue of organic materials being dispensed with to the greatest possible extent, the organic materials, as a result of water absorption, in the event of subsequent sudden heating, leading to the destruction of the housing by way of the so-called "popcorn" effect, the electronic component according to the invention achieves the best moisture classification as long as the circuit carrier material, such as semiconductor material, glasses or metals, is itself not sensitive to moisture.
l) A separate stopper applied on the active top side of the semiconductor chip makes it possible to prevent overloading through pressure or sheer forces in the case of the elastic external contacts. A small lamina may be used as a stopper of this type, the lamina being applied, if appropriate, with a smaller height than the height of the compliant rubber-elastic external contacts before or after the application of the external contacts in the geometrical centre of the electronic component.
m) If the stopper is soldered in or adhesively bonded in the course of final mounting, then all other forces which act on the electronic component are thereby also cushioned, so that the compliant rubber-elastic external contacts are not subjected to any mechanical overloading whatsoever by tension or sheer loading. Furthermore, the heat conduction into the superordinate printed circuit board thus increases depending on the material, such as copper, for example, and depending on the area size of the stopper, so that the thermal performance of the housing is thereby likewise improved.
n) Since all the materials used are thermostable far above 200° C., the electronic component is suitable for high-temperature environments.
o) In the case of stringent requirements made of the wiring density, a complete thin-film wiring may also be applied on the circuit carrier. The chip is subsequently adhesively bonded onto the circuit carrier, the optical positioning being defined by the photopatterned insulator/thin film. The rewiring process is then carried out, compliant rubber-elastic contacts of reduced height being applied on the chip, so that finally the latter with the semiconductor chip have the same height as the outer contacts on the circuit carrier. The contacts on the semiconductor chip, by virtue of their small height, also have better thermal values than the outer external contacts on the circuit carrier.

This method can easily be applied to small chips since the reliability of the contacts on the superordinate printed circuit board depends on their height and the distance from the geometrical centre or from the centroid of the housing. If larger chips are intended to be constructed, then either the total height or the compliant rubber-elastic contacts is or are increased by thinning the semiconductor chip by grinding. In the case of materials which, in terms of the expansion coefficient, do not correspond to the semi-conductor chip but rather are adapted to the printed circuit board material of the super-ordinate circuit, the external contacts arranged in the edge region of the circuit carrier may be replaced by standard solder balls.

p) The production method for an electronic component of this type is also suitable for producing electronic modules having active and passive components, especially because, with the use of silicon or sapphire as circuit carrier material, which also enables the use of active semiconductor ICs as circuit carrier, or with the use of expensive thermostable metals, as circuit carrier material, polished surfaces are available, which, by way of thin-film processes, may carry both capacitances and inductances, it being possible to construct resistors and coils directly with the patterned rewiring layer, so that it is possible to realize RLC networks using thin-film technology.

BRIEF DESCRIPTION OF THE FIGURES

The invention will now be explained in more detail with reference to the accompanying figures.

DETAILED DESCRIPTION

Figure 1:
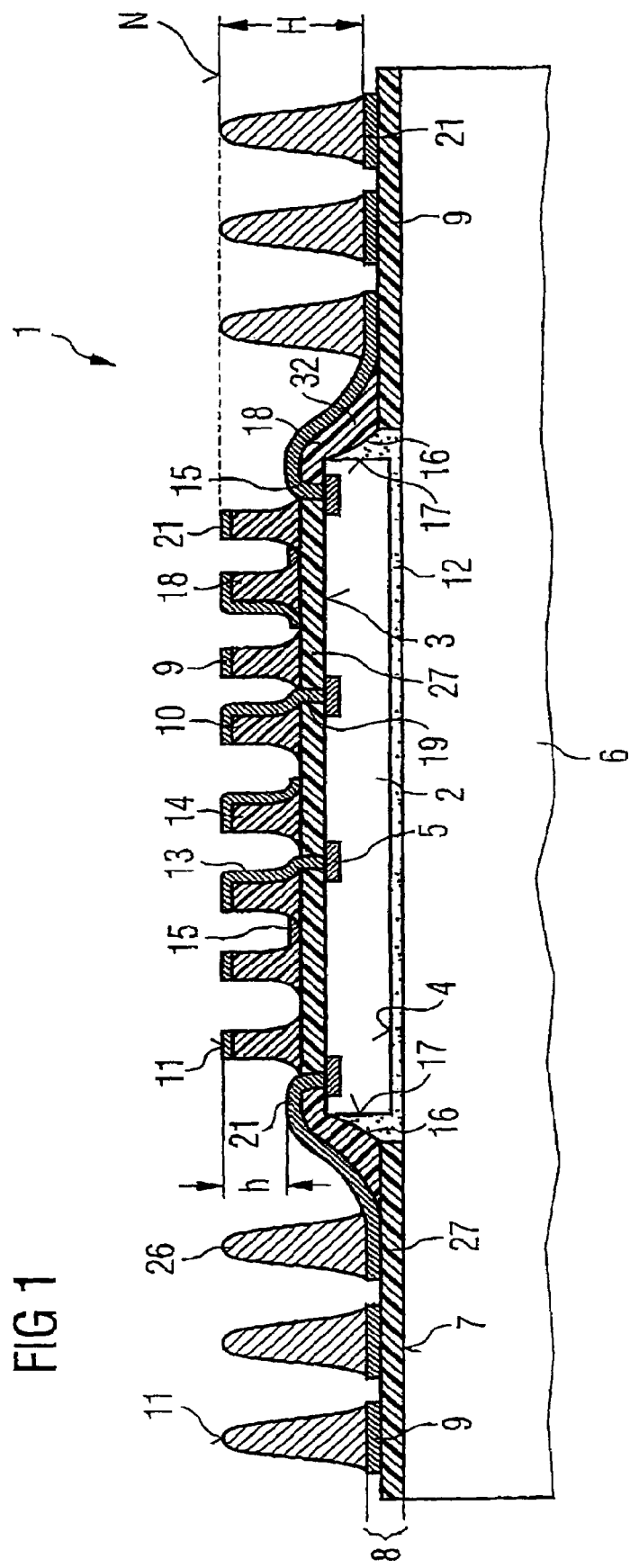
FIG. 1 shows a diagrammatic cross section through an electronic component with a semiconductor chip on a metallic circuit carrier, in accordance with a first embodiment of the invention.

FIG. 1 shows a diagrammatic cross section through an electronic component 1, with a semiconductor chip 2, on a circuit carrier 6. The circuit carrier 6 can have a planar carrier top side 7. The circuit carrier 6 can be a plate made of metal or made of a different material, the thermal expansion coefficient of which, with about 12 to 16 ppm per ° K, is adapted to the thermal expansion coefficient of a circuit substrate (not shown), such as of a printed circuit board of a superordinate circuit.

The semiconductor chip 2 can be connected by its chip rear side 4 to the circuit carrier 6 by an adhesive layer 12 in a mechanically sufficiently flexible manner. The adhesive layer can be a conductive adhesive, via which the chip rear side 4 can be put at earth potential. Furthermore, the electronic component 1 can be intensively cooled by the metallic circuit carrier 6.

The semiconductor chip 2 can have contact areas 5 on its active chip top side 3. Edge sides 17 of the semiconductor chip 2 can be covered by the adhesive layer 12, which can form an adhesive meniscus 16 at the edge sides 17, which can support the edge-covering effect of the rubber-elastic layer made of silicone arranged thereabove. Consequently, soft and fluid transitions 32 form from the semiconductor chip top side 3 to the circuit carrier top side 7 and from the relatively stiff insulation layer 27 on the semiconductor chip 2 to the relatively stiff insulation layer 27 on the circuit carrier 6.

A rewiring layer 8 can be arranged on the chip top side 3 and on the carrier top side 7 which is not covered by the semiconductor chip 2. The rewiring layer 8 can have, on the outside, a photopatterned insulation layer 27 made of benzocyclobutene and a patterned metal layer 21. The patterned insulation layer 27 can be arranged as insulation layer of the rewiring layer 8 on the circuit carrier 6 and on the semiconductor chip 2. External contact bodies in the form of bumps 14 can be arranged on the chip top side 3 with the insulation layer 27 in a manner applied by printing. Situated on the contact bodies can be metallic external contact top sides 11, which can be connected to contact areas 5 of the semiconductor chip 2 via conduction paths 13 and through contacts 19 and also rewiring lines 15. Moreover, external contact areas 9 of the rewiring layer 8 can be connected to contact areas 5 of the semiconductor chip via rewiring lines 15.

In a region above the semiconductor chip 2, the external contact surfaces 11 can lay at a higher level, for example, on the compliant bumps 14, than the external contact areas 9 in the region above the carrier top side 7. The height H from the external contact areas 9 of the carrier top side 7 up to the tips of the outer external contacts 26 and, respectively, up to the external contact top sides 11 can be greater than the height h of rubber-elastic external contacts 10 in the region of the semiconductor chip 2. The height difference between H and h can be dimensioned such that external contact top sides 11 of the rubber-elastic external contacts 10 lie at a level N essentially forming a planar area.

Since soldering balls shrink in the course of soldering-in and there is additionally a solder coating to about 100–150 μm on a superordinate printed circuit board (not shown) these changes are taken into account in the dimensioning of the height H of the outer external contacts 26 in the form of soldering balls. The compliant bumps 14 can be constructed from a silicone rubber. In the transition region 32 from the circuit substrate surface 7 with insulation layer 27 to the edges 17 of the semiconductor chip 2, the same rubber-elastic material as for the bumps can form a gentle transition.

Figure 2:
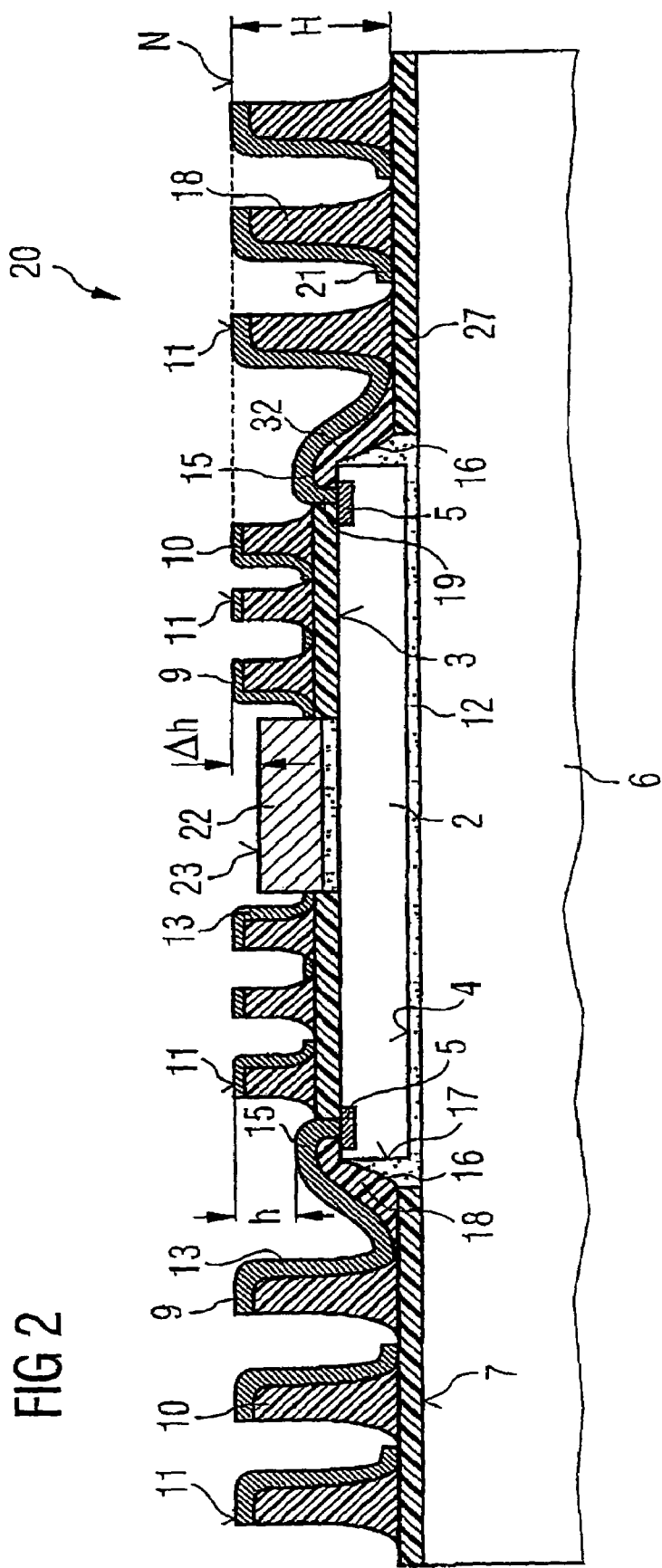
FIG. 2 shows a diagrammatic cross section through an electronic component with a semiconductor chip, in accordance with a second embodiment of the invention.

Any overloading of the compliant external contacts 10 on the chip top side 3 when making contact between the electronic component 1 and a printed circuit board (not shown here) of a superordinate circuit can be prevented by a stopper 22, which is shown in FIG. 2 and can be arranged at the area centroid of the electronic component 20 of FIG. 2 and whose top side 23 can be arranged at a distance Δh below the common level N of the external contacts 11. The distance Δh, is advantageous in particular when the electronic component 1 can be connected to a printed circuit board (not shown) by a pressure-adhering adhesive film, i.e, a "snap cure foil." This results in a solder-free pressure contact between the external contacts 26, 10 of the electronic component 1 and contact pads of the printed circuit board (not shown). Instead of a pressure-adhering adhesive film, a shrink adhesive (not shown), which shrinks on curing, and presses the component 1 with its external contacts 26 onto contact pads (not shown) of a printed circuit board (not shown) for the purpose of electrical contact-making can be used.

If the electronic component 1 is soldered with its external contacts 10, 26 and the stopper 22 onto a printed circuit board (not shown), then Δh returns towards zero. In this case, the stopper 22 can serve for fixing of the electronic component in the X and Y directions on the printed circuit board. The stopper 22 thus can relieve the stress on the compliant external contacts 10 and can limit their loading by shear stresses. If such an electronic component 1 is fixed on a printed circuit board (not shown) by a pressure-adhesive film or a shrink adhesive, then an improved mechanical reliability can be achieved and an increased current-carrying capacity can be possible. Since no electromigration of solder material can take place, an increased service life can be achieved.

The embodiment in accordance with FIG. 2 differs from the first embodiment in accordance with FIG. 1, moreover, by the fact that the external contacts having the height H on the top side 7 of the circuit carrier 6 also have rubber-elastic external contact bodies in the form of silicone bumps 14. The bumps 14 can carry external contact carriers 9, which can be electrically connected to contact areas 5 of the top side 3 of the semiconductor chip 2 via conduction paths 13 and rewiring lines 15 and also via through contacts 19. The structural components 9, 13, 15 and 19 of the patterned metal layer 21 can be produced by a photolithography step from a Cu/Ni metal coating on the three-dimensional top side made of silicone rubber for the bumps 14 and the transitions 32, and from benzocyclobutene on the top side 7 of the circuit carrier and on the chip topside 3. In this case, the external contact top sides 11 can be refined by an additional metal coating and may be coated with a solder layer.

The use of compliant external contacts 10 in accordance with FIG. 2 can make it possible to compensate for differences in the expansion behavior between the electronic component 20 according to the invention and a circuit substrate (not shown) on a superordinate circuit. As a result, it is possible to use circuit carriers having expansion coefficients so that the circuit carrier 6 may have a semiconductor wafer material, a semiconductor chip with an integrated circuit, a ground glass plate, a plastic plate or a plate made of an arbitrary metal.

Figure 3:
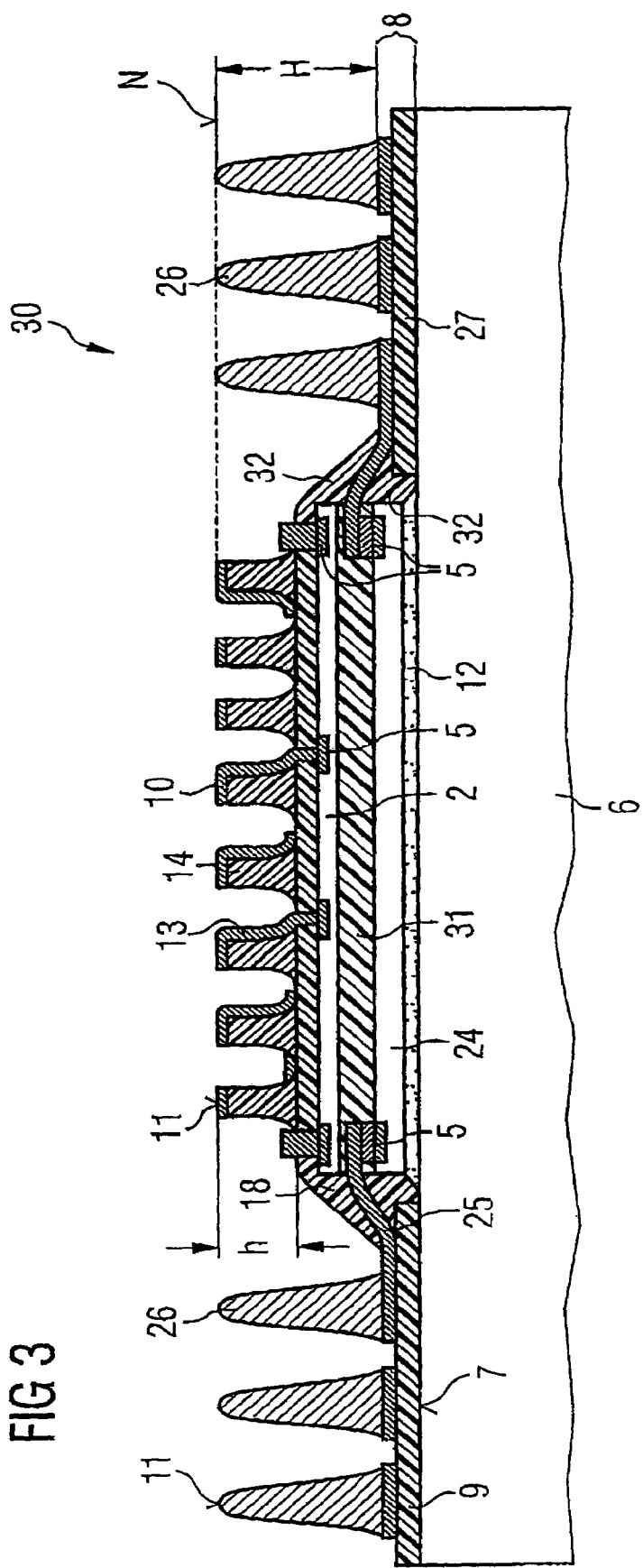
FIG. 3 shows a diagrammatic cross section through an electronic component, with stacked semiconductor chips, in accordance with a third embodiment of the invention.

FIG. 3 shows a diagrammatic cross section through an electronic component 30 in accordance with a third embodiment of the invention. Components having functions identical to those in FIGS. 1 and 2 are identified by the same reference symbols and are not discussed separately.

The electronic component 30 can have a stack including two semiconductor chips 2 and 24. In principle, as many semiconductor chips as desired can be stacked in a similar way. For this purpose, it is not necessary for the semiconductor chips 2 and 24 to have the same area as in this third embodiment of the invention.

The first lower semiconductor chip 24 in this third embodiment of the invention may have no external contacts on its top side 3. Rather, the connections to the contact areas 5 of the lower semiconductor chip 24 can be connected to outer external contacts 26 in the form of soldering balls via buried rewiring lines 25. The upper second semiconductor chip 2 can have compliant external contacts 10.

The external contact body in the form of compliant bumps 14 of the external contacts 10 can be made of the same rubber-elastic material as the transitions 32 at the edge sides 7 of the semiconductor chips 2 and 24. The buffer layer 31 between the semiconductor chips 2 and 24 also can have a rubber-elastic material.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1, 20, 30 Electronic component
2 Semiconductor chip
3 Active chip top side
4 Chip rear side
5 Contact areas
6 Circuit carrier
7 Carrier top side
8 Rewiring layer
9 External contact area
10 Compliant external contacts
11 External contact top sides
12 Adhesive layer
13 Conduction paths
14 Compliant bumps
15 Rewiring lines
16 Adhesive meniscus
17 Edge sides of the semiconductor chip
18 Rubber-elastic insulation
19 Passage contacts
21 Patterned metal layer (rewiring layer)
22 Stopper
23 Top side of the stopper
24 Semiconductor chip of a stack
25 Buried rewiring lines
26 Outer external contacts
27 Insulation layer
31 Buffer layer
32 Transition
Δh Distance between level N and stopper top side 24
h Height of the external contacts in the region of the semiconductor chip
H Height of the external contacts in the region of the circuit carrier
N Common level of the external contact top sides

I claim:

1. An electronic component, comprising:
at least one semiconductor chip, the semiconductor chip including an active chip top side, a chip rear side, and a plurality of contact areas arranged on the chip top side;
a circuit carrier, the circuit carrier having a carrier top side;
at least one patterned rewiring layer, the rewiring layer having external contact areas;
a plurality of external contacts arranged on the external contact areas, the contacts provided with conductive patterns extending from the top surface and connected to the contact areas of the chip top side through openings in an insulation layer positioned between the chip and the external contacts;

wherein the chip rear side is arranged on the carrier top side, the rewiring layer extends over the active chip top side and over the carrier top side, and the external contacts have heights, the heights being adapted to level the difference between chip top side and carrier top side, the external contact top sides being disposed at a common level.

2. The electronic component according to claim 1, wherein the circuit carrier has materials, the materials having thermal expansion coefficients adapted to the thermal expansion coefficient of a circuit substrate of a superordinate circuit.

3. The electronic component according to claim 1, wherein the circuit carrier has metal.

4. The electronic component according to claim 1, wherein an elastic adhesive layer is arranged between the chip rear side of the semiconductor chip and the carrier top side.

5. The electronic component according to claim 4, wherein the elastic adhesive layer is conductive.

6. The electronic component according to claim 1, wherein the circuit carrier has the form of a wafer on which the semiconductor chips are arranged in rows and columns at component positions.

7. Electronic component according to claim 1, wherein at least the external contacts on the semiconductor chip have conduction paths on a compliant bump.

8. A system, comprising:

a circuit carrier, the circuit carrier being made of metal and a plurality of semiconductor chips, the semiconductor chips having chip top sides and chip rear sides, the semiconductor chips being arranged with the chip rear side on a respective carrier top side, the semiconductor chips being electrically connected via a common rewiring layer among one another and to external contacts having different heights, the different heights of the external contacts levelling the level differences between the chip top sides and the carrier top side such that external contact top sides are disposed at a common level, the external contacts provided with conductive patterns extending from the top surface and connected to the contact areas of the chip top side through openings in an insulation layer positioned between the chip and the external contacts.

9. The circuit module according to claim 8, wherein the plurality of semiconductor chips are stacked one on the other, rewiring layers are arranged between the stacked semiconductor chips rewiring layers insulated conductor tracks lead to the external contacts on the circuit carrier at least the topmost semiconductor chip of the semiconductor chip stack having compliant, rubber-elastic external contacts.

10. A system, comprising:

a circuit carrier, the circuit carrier being made of metal and a plurality of semiconductor chips, the semiconductor chips having chip top sides and chip rear sides, the semiconductor chips being arranged with the chip rear side on a semiconductor chip, the semiconductor chips being electrically connected via a common rewiring layer among one another and to external contacts having different heights, the different heights of the external contacts levelling the level differences between the chip top sides and the carrier top side such that external contact top sides are disposed at a common level, the external contacts provided with conductive patterns extending from the top surface and connected to the contact areas of the chip top side through openings in an insulation layer positioned between the chip and the external contacts.

11. The circuit module according to claim 10, wherein the plurality of semiconductor chips are stacked one on the other, rewiring layers are arranged between the stacked semiconductor chips rewiring layers insulated conductor tracks lead to the external contacts on the circuit carrier at least the topmost semiconductor chip of the semiconductor chip stack having compliant, rubber-elastic external contacts.

* * * * *